(12) United States Patent
Cheah et al.

(10) Patent No.: US 10,971,440 B2
(45) Date of Patent: Apr. 6, 2021

(54) SEMICONDUCTOR PACKAGE HAVING AN IMPEDANCE-BOOSTING CHANNEL

(71) Applicant: Intel Corporation, Santa Clara, CA (US)

(72) Inventors: Bok Eng Cheah, Bukit Gambir (MY); Jackson Chung Peng Kong, Tanjung Tokong (MY); Khang Choong Yong, Puchong (MY); Po Yin Yaw, Bayan Lepas (MY); Kok Hou Teh, Bayan Lepas (MY)

(73) Assignee: Intel Coropration, Santa Clara, CA (US)

( * ) Notice: Subject to any disclaimer, the term of this patent is extended or adjusted under 35 U.S.C. 154(b) by 11 days.

(21) Appl. No.: 16/326,688

(22) PCT Filed: Sep. 30, 2016

(86) PCT No.: PCT/US2016/054943
§ 371 (c)(1),
(2) Date: Feb. 19, 2019

(87) PCT Pub. No.: WO2018/063381
PCT Pub. Date: Apr. 5, 2018

(65) Prior Publication Data
US 2019/0181080 A1    Jun. 13, 2019

(51) Int. Cl.
*H01L 23/498* (2006.01)
*H01L 23/538* (2006.01)
*H01L 25/065* (2006.01)
*H01L 25/10* (2006.01)
*H01L 23/64* (2006.01)
*H01L 23/66* (2006.01)

(52) U.S. Cl.
CPC .. *H01L 23/49816* (2013.01); *H01L 23/49811* (2013.01); *H01L 23/538* (2013.01);
(Continued)

(58) Field of Classification Search
CPC combination set(s) only.
See application file for complete search history.

(56) References Cited

U.S. PATENT DOCUMENTS 9,000,577 B2    4/2015  Droege et al.
2003/0087634 A1  5/2003  Raghavan et al.
(Continued)

OTHER PUBLICATIONS

International Preliminary Report on Patentability for International Patent Application No. PCT/US2016/054943, dated Apr. 11, 2019, 6 pgs.
(Continued)

*Primary Examiner* — Nduka E Ojeh
(74) *Attorney, Agent, or Firm* — Schwabe, Williamson & Wyatt, P.C.

(57) ABSTRACT

Semiconductor package assemblies and semiconductor packages incorporating an impedance-boosting channel between a transmitter die and a receiver die are described. In an example, a semiconductor package includes a package substrate incorporating the impedance-boosting channel having a first arc segment connected to the transmitter die and a second arc segment connected to the receiver die. The arc segments extend around respective vertical axes passing through a transmitter die electrical bump and a receiver die electrical bump, respectively. Accordingly, the arc segments introduce an inductive circuitry to increase signal integrity of an electrical signal sent from the transmitter die to the receiver die.

22 Claims, 7 Drawing Sheets

(52) U.S. Cl.
CPC ............ *H01L 23/64* (2013.01); *H01L 23/645* (2013.01); *H01L 23/66* (2013.01); *H01L 25/0655* (2013.01); *H01L 25/10* (2013.01); *H01L 2224/16227* (2013.01); *H01L 2924/15192* (2013.01); *H01L 2924/15311* (2013.01); *H01L 2924/3025* (2013.01); *H01L 2924/30111* (2013.01)

(56) References Cited

U.S. PATENT DOCUMENTS

| | | |
|---|---|---|
| 2007/0038789 A1 | 2/2007 | Marcri et al. |
| 2007/0178766 A1* | 8/2007 | Banerjee ................ H05K 1/025 439/638 |
| 2007/0297520 A1 | 12/2007 | Ho et al. |
| 2011/0050334 A1* | 3/2011 | Pan ......................... H01L 25/16 327/564 |
| 2011/0095854 A1* | 4/2011 | Nishimura ............. H01R 4/023 335/299 |
| 2013/0313709 A1 | 11/2013 | Hinck et al. |
| 2017/0179050 A1* | 6/2017 | Kariyazaki .......... H05K 1/0231 |
| 2017/0194310 A1* | 7/2017 | Evans ..................... H01L 25/18 |

OTHER PUBLICATIONS

International Search Report and Written Opinion for International Patent Application No. PCT/US2016/054943 dated Jun. 27, 2017, 10 pgs.

\* cited by examiner

Figure 10 ic package, in accordance with an embodiment.

SEMICONDUCTOR PACKAGE HAVING AN IMPEDANCE-BOOSTING CHANNEL

CROSS-REFERENCE TO RELATED APPLICATION

This patent application is a U.S. National Phase Application under 35 U.S.C. § 371 of International Application No. PCT/US2016/054943, filed Sep. 30, 2016, entitled "SEMICONDUCTOR PACKAGE HAVING AN IMPEDANCE-BOOSTING CHANNEL," which designates the United States of America, the entire disclosure of which is hereby incorporated by reference in its entirety and for all purposes.

TECHNICAL FIELD

Embodiments are in the field of integrated circuit packages and, in particular, semiconductor packages including on-package interfaces for multi-chip communications.

BACKGROUND

Multi-chip packages include several integrated circuit dies in communication with each other through on-package interfaces. For example, a transmitter die may communicate with a receiver die through electrical bumps interconnected by electrical routing. Multi-chip packages may allow for heterogeneous integration of dies, lower manufacturing costs, lower power consumption, and shorter development cycles of the integrated circuit packages. Thus, a demand for such packages is rising.

A size and cost of multi-chip packages directly correlates with a length between dies of the multi-chip package. Channel lengths are currently in a range of 3-5 mm, and reducing the channel lengths further may enhance the advantages of multi-chip packages. As channel lengths decrease below the current range, however, signal integrity may be affected by impedance mismatch in the die interconnection. For example, reducing the lengths of channels between companion chips of a multi-chip package may cause signal reflections, which can lead to functionality risks, such as double-clocking and/or false triggering.

DESCRIPTION OF EMBODIMENTS

Semiconductor packages incorporating impedance-boosting channels having several interconnected and laterally separated arc segments to introduce an inductive circuitry connecting a transmitter die to a receiver die are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing multi-chip package designs may employ a terminated receiver die circuitry to match impedance of the electrical routing carrying an electrical signal from a transmitter die. Such terminated dies can reduce signal loss. For example, terminations at one or more of the integrated dies may include a design termination resistance to avoid reflections. The terminations, however, are necessarily accompanied by power loss in the resistive circuitry. Thus, terminated receiver dies require a trade-off between signal integrity and power consumption. Accordingly, it may be advantageous to provide a multi-chip package having integrated dies that include unterminated die circuitry and that include electrical routing having a length of less than 3 mm between the integrated dies.

In an aspect, a multi-chip package includes a package substrate having unterminated dies placed in electrical communication with each other by a short electrical channel. For example, the electrical channel may extend over a linear distance of less than 3 mm, e.g., 1 mm or less, between a transmitter bump pad connected to a transmitter electrical bump and a receiver bump pad connected to a receiver electrical bump. The short electrical channel may be an impedance-boosting channel having an inductive circuitry to increase an effective impedance of the channel. For example, the impedance-boosting channel may include arc segments extending around respective axes passing through respective die bumps. The arc segments may introduce self-inductance in the channel, which may decrease reflection noise in the signal line. Since the multi-chip package having inductive circuitry may be unterminated, power consumption of the package may be reduced as compared to conventional multi-chip packages having terminated dies. Furthermore, manufacturing costs of the multi-chip package may decrease as compared to conventional multi-chip packages having terminated dies because the silicon footprint may be further reduced.

Figure 1:
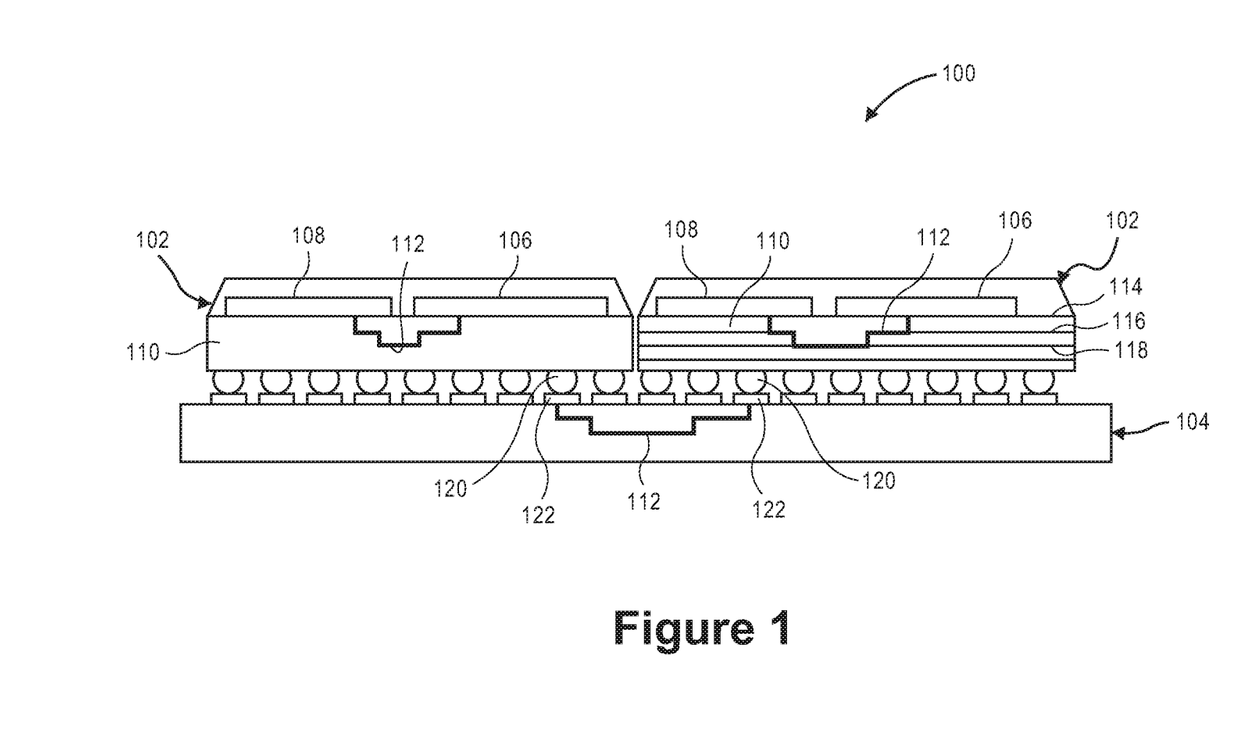
FIG. 1 illustrates a sectional view of a semiconductor package assembly, in accordance with an embodiment.

Referring to FIG. 1, a sectional view of a semiconductor package assembly is illustrated in accordance with an embodiment. A semiconductor package assembly 100 may include one or more semiconductor packages 102 having integrated dies in communication with each other. More particularly, electrical signals may be communicated between integrated dies mounted on a same package substrate or different package substrates.

In an embodiment, semiconductor package 102 is a multi-chip package having a transmitter die 106 and a receiver die 108 mounted on a same package substrate 110. Transmitter die 106 may be coupled to receiver die 108 by an impedance-boosting channel 112 extending through one or more planes of package substrate 110.

In an embodiment, several semiconductor packages 102 of semiconductor package assembly 100 may be mounted on a circuit board 104. For example, transmitter die 106 of a first semiconductor package 110 may be coupled to receiver die 108 of a different semiconductor package 110 by an impedance-boosting channel 112. Impedance-boosting channel 112 may extend through one or more planes of circuit board 104 between a pair of semiconductor packages 102 having respective dies 106, 108. The pair of semiconductor packages 102 of semiconductor package assembly 100 may be ball grid array (BGA) components having several solder balls 120 arranged in a ball field, i.e., an array of solder balls arranged in a grid or other pattern. Each solder ball 120 may be mounted and attached to a corresponding contact pad 122 of circuit board 104. Circuit board 104 may be a motherboard or another printed circuit board of a computer system. Accordingly, the solder ball 120 and contact pad 122 attachments may provide a physical and electrical interface between transmitter die 106 mounted on the first semiconductor package 102, e.g., a rightward semiconductor package 102, and receiver die 108 mounted on the second semiconductor package, e.g., a leftward semiconductor package.

Whether transmitter die 106 and receiver die 108 are mounted on a same or different package substrates 110, impedance-boosting channel 112 may extend between transmitter die 106 and receiver die 108 through vertical and horizontal interconnects. For example, package substrates 110 and or circuit board 104 may include several conductive trace layers extending along horizontal planes, e.g., a top plane 114, a reference plane 116, and a bottom plane 118. The conductive trace layers or horizontal planes 114, 116, and 118 may consist of a plurality of signal traces and/or conductive pads. Reference plane 116 may be a voltage reference plane that provides an electrical current return path to the signal traces. Reference plane 116 may be associated to a reference voltage, e.g., a power supply ($V_{cc}$) voltage or a ground ($V_{ss}$) voltage.

Top plane 114 may be a conductive layer on a top surface of package substrate 110 at which electrical bumps (not shown) of an integrated circuit die 106, 108 attach to electrical pads (not shown) of package substrate 110. Impedance-boosting channel 112 may extend along the planes, as described below, to carry an electrical signal from transmitter die 106 to receiver die 108 through the stacked layers of package substrate 110.

Figure 2:
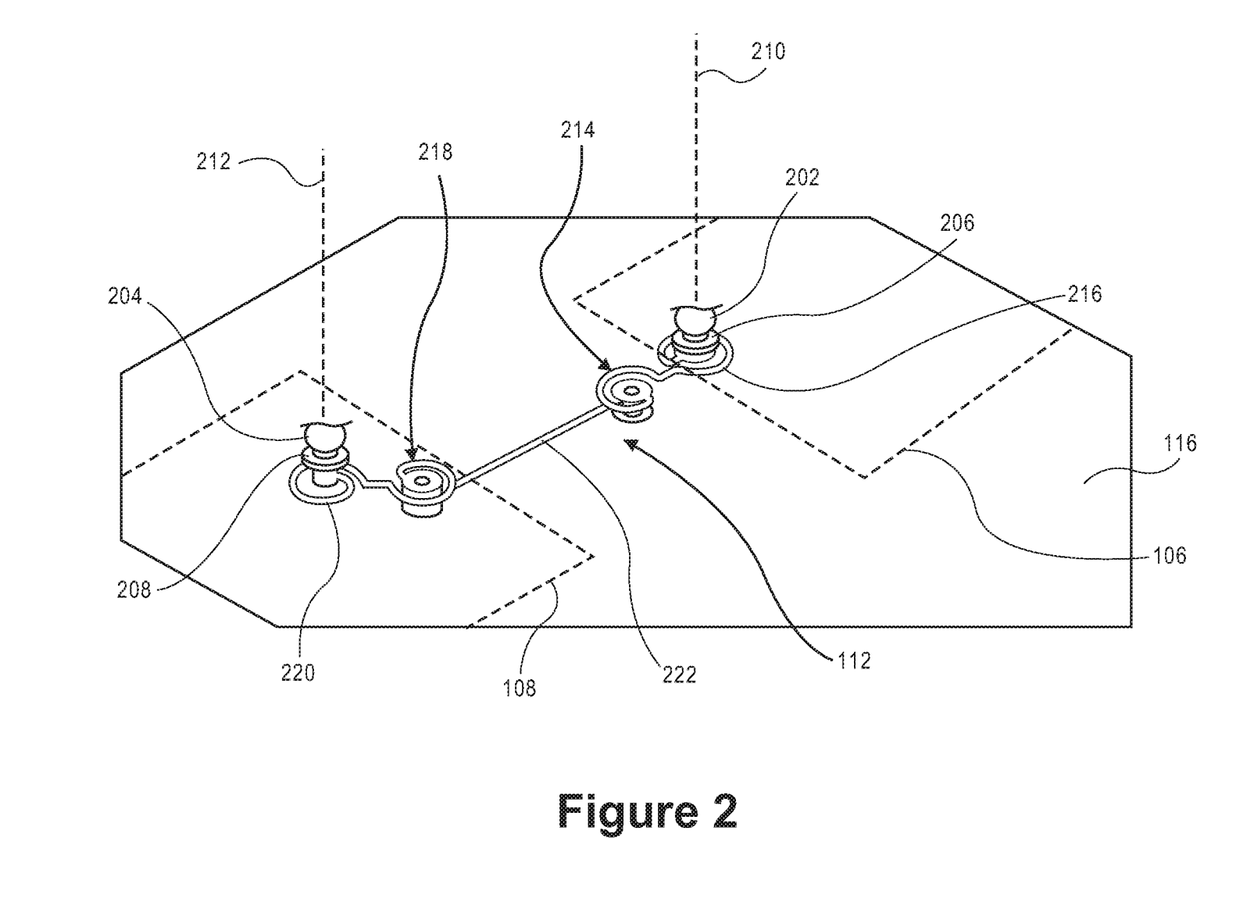
FIG. 2 illustrates a perspective view of a semiconductor package having an impedance-boosting channel, in accordance with an embodiment.

Referring to FIG. 2, a perspective view of a semiconductor package having an impedance-boosting channel is illustrated in accordance with an embodiment. Semiconductor package assembly 100 may include transmitter die 106 and receiver die 108, both of which are represented by dashed lines indicating footprints of the respective dies on reference plane 116. Transmitter die 106 and receiver die 108 may include respective terminal bumps, e.g., C4 bumps, to transmit/receive signals between dies. For example, transmitter die 106 may include a transmitter electrical bump 202 and receiver die 108 may include a receiver electrical bump 204. The terminal bumps may provide laterally separated terminals of an electrical connection for communicating electrical signals between transmitter die 106 and receiver die 108.

The terminal bumps may be connected to respective bonding pads on package substrate 110. For example, transmitter electrical bump 202 may be mounted on a transmitter bump pad 206, and receiver electrical bump 204 may be mounted on receiver bump pad 208. In an embodiment, transmitter bump pad 206 and receiver bump pad 208 are disposed on laterally separated axes. For example, transmitter bump pad 206 may be disposed along a first vertical axis 210, and receiver bump pad 208 may be disposed along a second vertical axis 212 laterally offset from first vertical axis 210. Accordingly, several integrated circuit dies may be mounted on respective bump pads on package substrate 110.

An electrical connection may be formed between the integrated circuit dies through the package substrate 110. That is, transmitter die 106 may send an electrical signal to receiver die 108 through an impedance-boosting channel 112 extending between transmitter bump pad 206 and receiver bump pad 208 at laterally separated locations. Transmitter bump pad 206 and receiver bump pad 208 may be separated by a lateral distance that provides a compact X-Y form factor. For example, the lateral distance measured directly between transmitter electrical bump 202 and receiver electrical bump 204 may be less than an interconnect length of a typical multi-chip package. In an embodiment, the lateral distance between ends of impedance-boosting channel 112, i.e., a length of a line drawn horizontally between first vertical axis 210 and second vertical axis 212, may be 1 mm or less.

In an embodiment, impedance-boosting channel 112 includes several segments distributed across several vertically separated planes of package substrate 110. For example, impedance-boosting channel 112 includes transmitter bump pad 206 and receiver bump pad 208 within top plane 114 of package substrate 110. Impedance-boosting channel 112 may also include one or more impedance-boosting segments within reference plane 116 of package substrate 110. For example, a first impedance boosting segment 214 may include a first arc segment 216 extending around first vertical axis 210. Similarly, a second impedance-boosting segment 218 may include a second arc segment 220 extending around second vertical axis 212. A component of impedance-boosting channel 112 may also be within bottom plane 118 of package substrate 110. For example, a lateral interconnect 222 may extend horizontally between microvias connected to first impedance-boosting segment 214 and second impedance-boosting segment 218.

Figure 3:
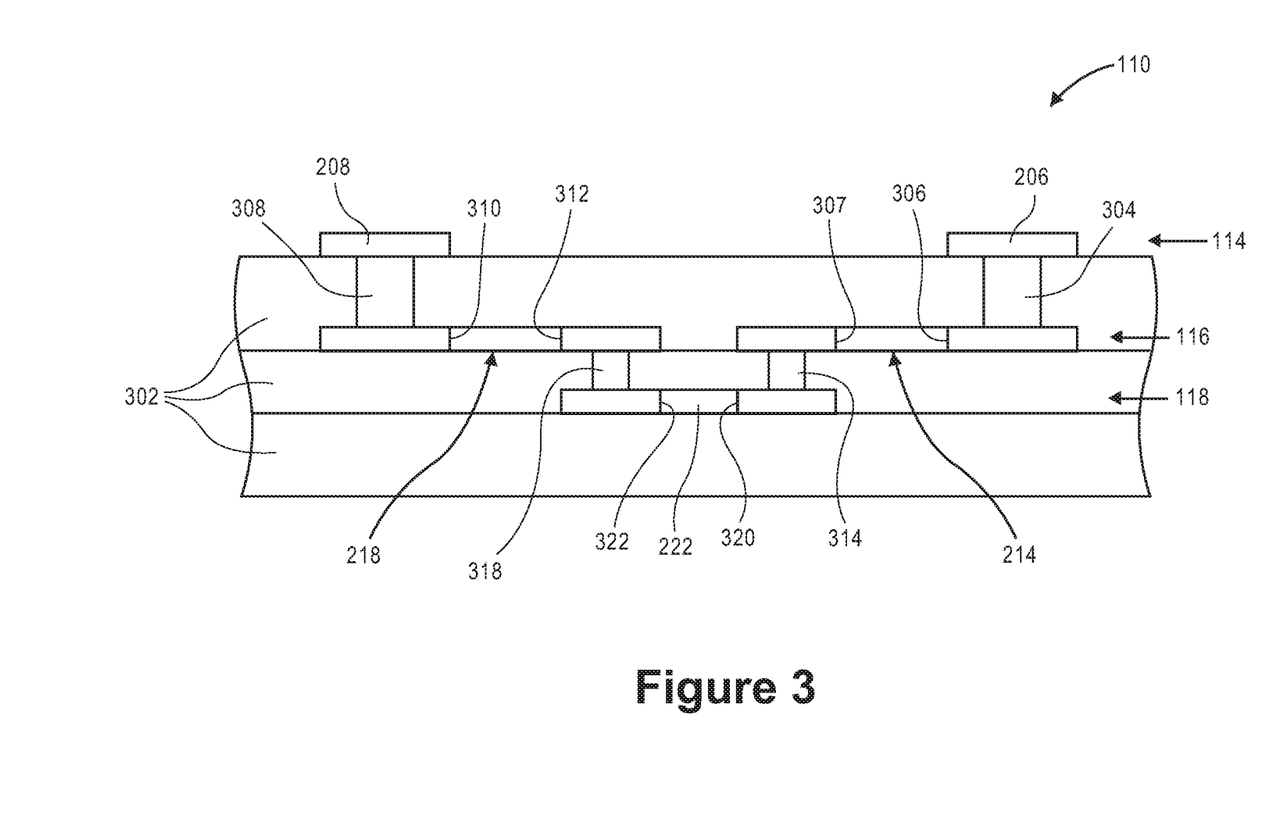
FIG. 3 illustrates a sectional view of a semiconductor package having an impedance-boosting channel, in accordance with an embodiment.

Referring to FIG. 3, a sectional view of a semiconductor package having an impedance-boosting channel is illustrated in accordance with an embodiment. The planes of package substrate 110 may include conductive portions laminated between layers of dielectric material, i.e., dielectric layers 302. For example, top plane 114 may extend laterally over an upper dielectric layer 302, reference plane 116 may extend laterally over an intermediate dielectric layer 302, and bottom plane 118 may extend laterally over a lower dielectric layer 302. Accordingly, the conductive layers forming impedance-boosting channel 112 may be vertically connected by several microvias.

Top plane microvias may extend from channel portions within top plane 114 to channel portions within reference plane 116. For example, a first top plane microvia 304 may extend from transmitter bump pad 206 within top plane 114 to an end of first impedance-boosting segment within reference plane 116. More particularly, first impedance-boosting segment 214 may include a first end 306 and a second end 307, and first top plane microvia 304 may be coupled to first end 306. Similarly, a second top plane microvia 308 may extend from receiver bump pad 208 to an end of second impedance-boosting segment 218. More particularly, second impedance-boosting segment 218 may include a third end 310 and a fourth end 312, and second top plane microvia 308 may be coupled to third end 310. Thus, first end 306 may be coupled to transmitter bump pad 206 by first top plane microvia 304, and third end 310 may be coupled to receiver bump pad 208 by second top plane microvia 308.

Bottom plane microvias may extend from channel portions within reference plane 116 to channel portions within bottom plane 118. For example, a first bottom plane microvia 314 may extend vertically from second end 307 of first impedance-boosting segment 214 within reference plane 116 to a lateral interconnect 222 within bottom plane 118. Similarly, a second bottom plane microvia 318 may extend vertically from fourth end 312 of second impedance-boosting segment 218 to lateral interconnect 222. Lateral interconnect 222 may extend horizontally within bottom plane 118 from a first terminal 320 at first bottom plane microvia 314 to a second terminal 322 at second bottom plane microvia 318. Thus, first terminal 320 may be coupled to second end 307 by first bottom plane microvia 314, and second terminal 322 may be coupled to fourth end 312 by second bottom plane microvia 318.

An electrical signal path of a signal transmitted between transmitter die 106 and receiver die 108 may extend between transmitter bump pad 206 and receiver bump pad 208. In an embodiment, the electrical signal is carried from transmitter bump pad 206 vertically downward through first top plane microvia 304 to first end 306 of first impedance-boosting segment 214. The electrical signal may then be carried by first impedance-boosting segment 214 through reference plane 116 to second end 307. First bottom plane microvia 314 may carry the electrical signal from second end 307 to first terminal 320 of lateral interconnect 222, and the electrical signal may propagate through lateral interconnect 222 within bottom plane 118 below reference plane 116 to second terminal 322. Second bottom plane microvia 318 may carry the electrical signal from second terminal 322 vertically upward to fourth end 312 of second impedance-boosting segment 218. Second impedance-boosting segment 218 may carry the electrical signal through reference plane 116 from fourth end 312 to third end 310. The electrical signal may then propagate vertically upward through second top plane microvia 308 from third end 310 to receiver bump pad 208. Accordingly, the electrical signal may travel vertically between layers of package substrate 110, and horizontally along several planes of package substrate 110. One or more segments of impedance-boosting channel 112 may extend along curvilinear paths in the lateral or horizontal direction to generate self-inductance within the interconnect structure.

Figure 4:
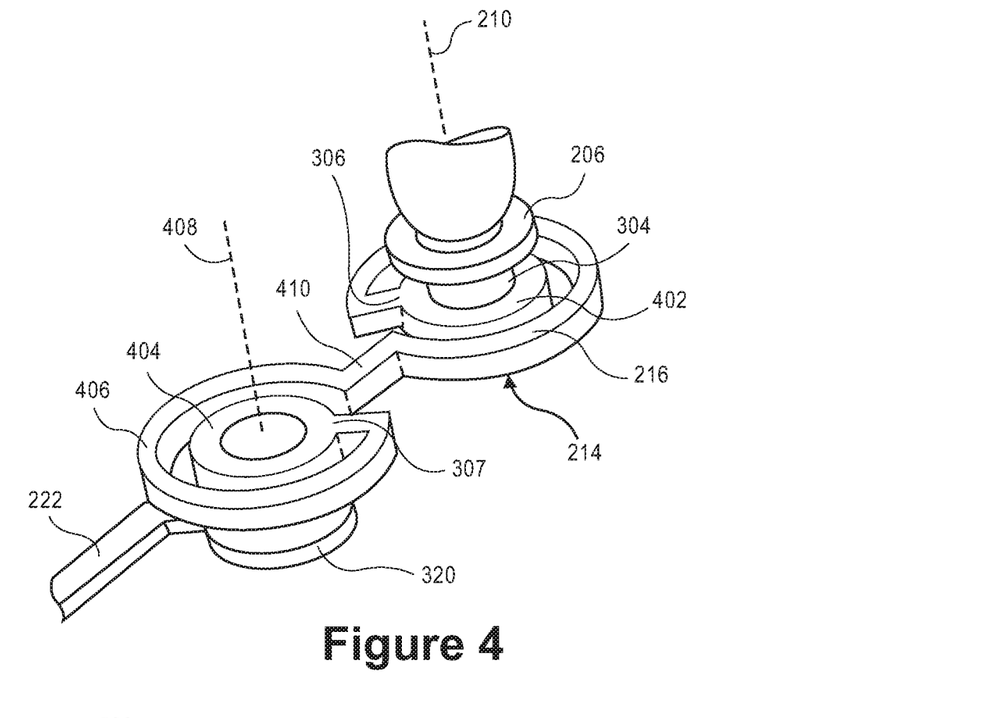
FIG. 4 illustrates a perspective view of an impedance-boosting channel, in accordance with an embodiment.

Referring to FIG. 4, a perspective view of an impedance-boosting channel is illustrated in accordance with an embodiment. First impedance-boosting segment 214 may include one or more arc segments. For example, first impedance-boosting segment 214 may extend between first end 306 at a first interconnect pad 402 and second end 307 at a second interconnect pad 404. First interconnect pad 402 and second interconnect pad 404 may be disposed within reference plane 116 at respective microvias. For example, first top plane microvia 304 may have an upper end connected to transmitter bump pad 206, and the microvia may have a lower end connected to first interconnect pad 402. Accordingly, first interconnect pad 402 may be disposed along first vertical axis 210 below transmitter bump pad 206. Similarly, first bottom plane microvia 314 (not shown) may have an upper end connected to second interconnect pad 404, and the microvia may have a lower end connected to first terminal 320 of lateral interconnect 222. Second interconnect pad 404 may be disposed along third vertical axis 408 above first terminal 320.

Each arc segment of the impedance-boosting segments may extend along a curvilinear path. For example, first arc segment 216 may extend around first interconnect pad 402 at a fixed or variable radial distance from first vertical axis 210. Similarly, first impedance-boosting segment 214 may include a third arc segment 406 extending around second interconnect pad 404. Second interconnect pad 404 may be disposed along the third vertical axis 408, which may be laterally offset from first vertical axis 210. Third arc segment 406 may extend around third vertical axis 408 at a fixed or variable radial distance from third vertical axis 408. Thus, first impedance-boosting segment 214 may include a pair of arc segments having respective curvilinear traces that curve around an angular portion of respective pad perimeters, and about respective axes.

The curvilinear traces of each impedance-boosting segment may be interconnected with each other. For example, first impedance-boosting segment 214 may be interconnected with second impedance-boosting segment 218 at a point along the channel between first end 306 and second end 307. In an embodiment, first impedance-boosting segment 214 includes a linear segment 410 extending from first arc segment 216 to third arc segment 406. By way of example, first arc segment 216 may extend clockwise about first vertical axis 210 from first end 306 to linear segment 410, and third arc segment 406 may extend clockwise about third vertical axis 408 from second end 307 to linear segment 410. Accordingly, linear segment 410 may form a junction between a pair of arc segments of an impedance-boosting channel 112.

Figure 5:
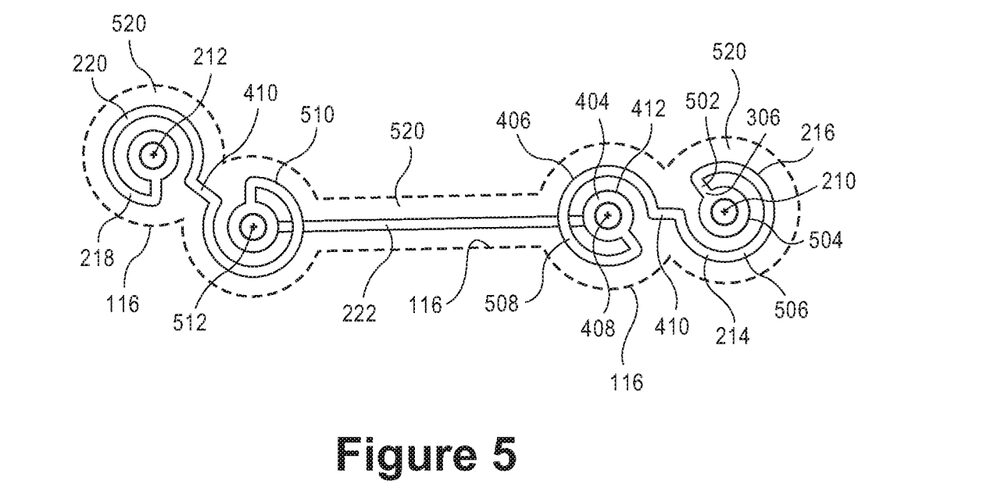
FIG. 5 illustrates a top view of an impedance-boosting channel, in accordance with an embodiment.

Referring to FIG. 5, a top view of an impedance-boosting channel is illustrated in accordance with an embodiment. The arc segments of impedance-boosting channel 112 may include circumferential segments. For example, a radial segment 502 may extend radially from a first pad perimeter 504 of first interconnect pad 402 at first end 306 to a first circular segment 506 at a radius from first vertical axis 210. Radial segment 502 may have a length equal to the radius of first circular segment 506 minus a radius of first pad perimeter 504. First circular segment 506 may extend from a radially outward end of radial segment 502. More particularly, first arc segment 216, which may be first circular segment 506, may extend around first pad perimeter 504 at a fixed radius from first vertical axis 210. Accordingly, first circular segment 506 may extend from radial segment 502 to linear segment 410 at a constant, or nearly constant, distance from first vertical axis 210.

First arc segment 216 may have an arc length surrounding an angular portion of first pad perimeter 504. The arc length may subtend an angle taken about first vertical axis 210. For example, the angle may be equal to, less than, or more than, 360°. When first arc segment 216 is a circular segment, it will be appreciated that the angle is less than 360° such that the ends of first arc segment 216 do not contact each other.

Linear segment 410 of first impedance-boosting segment 214 may extend from first arc segment 216, e.g., an end of first circular segment 506, to third arc segment 406. In an embodiment, third arc segment 406 includes a third circular segment 508 extending from linear segment 410 around second interconnect pad 404. More particularly, second interconnect pad 404 may include a second pad perimeter 412 around third vertical axis 408, and third arc segment 406 may extend around second pad perimeter 412 from linear segment 410. Third arc segment 406 may extend at a fixed radius from third vertical axis 408, and thus, third arc segment 406 may be a circular segment.

Still referring to FIG. 5, it can be seen that first impedance-boosting segment may have an overall dumbbell shape including first arc segment 216 around first vertical axis 210, third arc segment 406 around third vertical axis 408, and linear segment 410 between the arc segments. This dumbbell, or dog bone, shape increases an effective impedance of impedance-boosting channel 112. As described below, however, the effective impedance may likewise be boosted by other arc segment geometries. For example, the arc segments may not be circular segments, and may instead have variable radial distances from respective axes.

An edge of surrounding conductive structures, e.g., voltage reference plane (within reference plane 116) and conductive traces (such as signal and/or guard traces within bottom plane 118) is indicated by a dashed line in FIG. 5. For example, conductive structures (i.e., voltage reference plane) may extend around the impedance-boosting segments within reference plane 116. Similarly, conductive structures (i.e., conductive traces) may surround other regions of impedance-boosting channel 112, e.g., one or more signal and/or guard traces may extend adjacent to lateral interconnect 222 within bottom plane 118. The edge of surrounding conductive structures for both reference plane 116 and bottom plane 118 is combined in FIG. 5 in order to ease the illustration of boundary between impedance-boosting channel 112 and surrounding conductive structures. It will be appreciated that the voltage reference plane between first impedance-boosting segment 214 and second impedance-boosting segment 218 may be a solid plane, i.e., continuous reference plane 116 over lateral interconnect 222 within bottom plane 118. The surrounding conductive structures may be separated from impedance-boosting channel 112 by a dielectric spacer 520. For example, dielectric spacer 520 may include an insulating medium, e.g., a dielectric material, disposed between reference plane 116 and impedance-boosting segments of impedance-boosting channel 112. More particularly, the arc segments may extend through dielectric spacer such that dielectric spacer insulates impedance-boosting channel 112 from adjacent conductive structures (i.e., voltage reference plane). The surrounding conductive structures may include guard traces that associate with a reference voltage to shield impedance-boosting channel 112 from electromagnetic signals of adjacent conductive traces, i.e., to minimize undesired energy coupling between adjacent signal traces within bottom plane 118. For example, dielectric spacer may be disposed between lateral interconnect 222 and an adjacent conductive trace (e.g., guard trace) within bottom plane 118 to shield the electrical signal transmitted through impedance-boosting channel 112 from adjacent electrical signals. Such shielding may prevent cross-talk between adjacent electrical signals. It will be appreciated that, although portions of impedance-boosting channel 112 (such as arc segments) may be located within reference plane 116, reference plane 116 may be considered to extend around the impedance-boosting segments since reference plane 116 includes the surrounding conductive structures.

The geometry of first impedance-boosting segment 214 has been discussed by way of example, and it will be appreciated that second impedance-boosting segment 218 may have a similar geometry. For example, second impedance-boosting segment 218 may include second arc segment 220 curving around second vertical axis 212. Furthermore, second impedance-boosting segment 218 may include a fourth arc segment 510 extending around a fourth vertical axis 512. Fourth vertical axis 512 may be laterally offset from second vertical axis 212, and thus, second arc segment 220 and fourth arc segment 510 may be interconnected by a respective linear segment 410. Accordingly, second impedance-boosting segment 218 may have a geometry similar to that of first impedance-boosting segment 214. The impedance-boosting segments may, however, be laterally separated from each other within a same plane, e.g., reference plane 116, or within different planes. For example, first impedance-boosting segment 214 may be within reference plane 116 and second impedance-boosting segment 218 may be within bottom plane 118.

Figure 6:
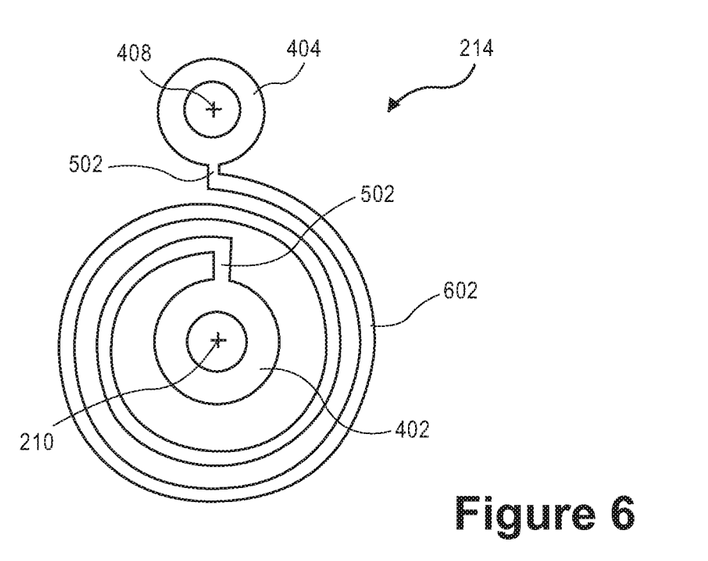
FIG. 6 illustrates a top view of an impedance-boosting segment of an impedance-boosting channel, in accordance with an embodiment.

Referring to FIG. 6, a top view of an impedance-boosting segment of an impedance-boosting channel is illustrated in accordance with an embodiment. The arc segments of impedance-boosting channel 112, e.g., first impedance-boosting segment 214, may include a spiral segment 602. Spiral segment 602 may extend along a curvilinear path at a variable radius from a respective axis, e.g., first vertical axis 210. The ends of spiral segment 602 may therefore be spaced apart from first vertical axis 210 by different distances. For example, first impedance-boosting segment 214 may include radial segments 502 attached to first interconnect pad 402 and second interconnect pad 404, respectively, and spiral segment 602 may extend around first vertical axis 210 between the radial segments 502. Accordingly, spiral segment 602 may include less or more than one revolution around first vertical axis 210, i.e., the arc length of spiral segment 602 may subtend an angle greater than 360°. More particularly, spiral segment 602 may include more than one revolution, e.g., several revolutions, around a respective vertical axis.

In an embodiment, first impedance-boosting segment 214 includes an arc segment around one interconnect pad, but not around another. For example, spiral segment 602 may extend around first vertical axis 210, and may be connected to second interconnect pad 404 directly by a corresponding radial segment 502. Second interconnect pad 404, however, may not be encircled by a corresponding arc segment, as shown.

Figure 7:
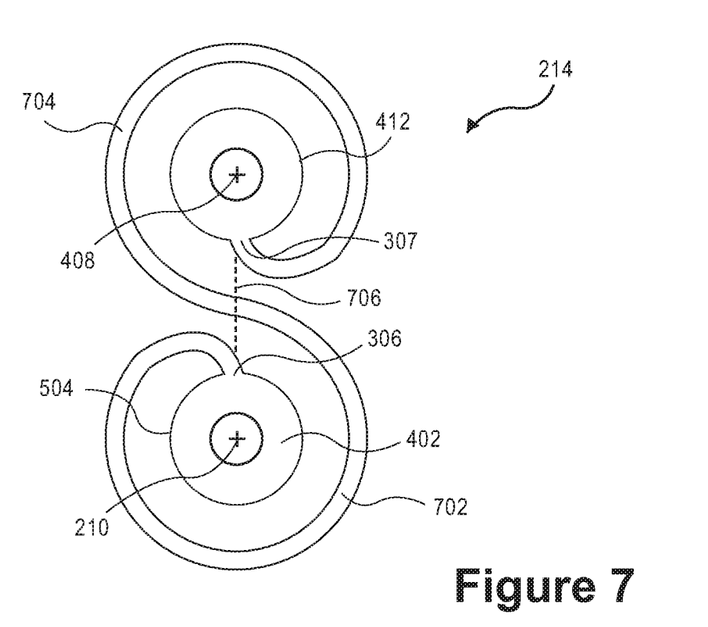
FIG. 7 illustrates a top view of an impedance-boosting segment of an impedance-boosting channel, in accordance with an embodiment.

Referring to FIG. 7, a top view of an impedance-boosting segment of an impedance-boosting channel is illustrated in accordance with an embodiment. An impedance-boosting segment of impedance-boosting channel 112 may include several spiral segments 602 extending around respective axes. For example, first impedance-boosting segment 214 may include a first spiral segment 702 extending from first end 306 at first pad perimeter 504 around first vertical axis 210. Similarly, a second spiral segment 704 may extend from second end 307 at second pad perimeter 412 around third vertical axis 408. First spiral segment 702 and second spiral segment 704 may meet at a midline 706 between first end 306 and second end 307. In an embodiment, midline 706 is a geometric reference line drawn between first vertical axis 210 and third vertical axis 408. First spiral segment 702 may transition smoothly into second spiral segment 704 at midline 706. Accordingly, an impedance-boosting segment having an S-shaped geometry may be formed. The impedance-boosting segment may not include radial segments, as shown. Alternatively, one or more radial segment 502 may be present between a respective pad perimeter and a beginning of a respective spiral segment 702, 704.

The impedance-boosting segment geometries described above are offered by way of example. That is, one skilled in the art may contemplate alternative geometries that are hybrid geometries of those already described. For example, spiral segments 602 as described in FIGS. 6 and 7 may be combined with the dumbbell shape as described in FIG. 5. In such an embodiment, first arc segment 216 may include spiral segment 602 between first pad perimeter 504 and linear segment 410. Similar variations and hybridizations of impedance-boosting segment geometries will be understood by one skilled in the art.

As described above, impedance-boosting segments may be disposed within an anti-pad region of reference plane 116. That is, the segments of impedance-boosting channel 112 may be separated from adjacent conductive structures by dielectric spacer 520. In an embodiment, traces of impedance-boosting segment, such as the arc segments or lateral interconnect 222, have a trace width in a range of 2-15 microns, e.g., 9 microns. A spacing between the adjacent conductive structures and the impedance-boosting traces may be in a range of 2-20 microns, e.g., 14 microns. In an embodiment, a distance between respective top plane microvias and bottom plane microvias within a same impedance-boosting segment may be in a range of 50-70 microns, e.g., 60 microns. Accordingly, an overall dimension of dielectric spacer within which an impedance-boosting segment is located may be less than 100 microns. That is, an outermost dimension across the entire structure of the impedance-boosting segment may be less than 100 microns.

As described above with respect to FIG. 1, impedance-boosting channel 112 may extend at least partly through circuit board 104. For example, circuit board 104 may include a transmitter contact pad disposed along a first vertical axis, and a receiver contact pad disposed along a second vertical axis. Impedance-boosting channel 112 within circuit board 104 may have a similar geometry to impedance-boosting channel 112 within package substrate 110. That is, impedance-boosting channel 112 may extend between the transmitter contact pad and the receiver contact pad and include one or more arc segments to increase impedance of the channel within circuit board 104. The transmitter contact pad and the receiver contact pad may be connected to respective solder balls 120 of separate semiconductor packages. For example, a first semiconductor package 102 mounted on circuit board 104 may include a respective solder ball 120 attached to the transmitter contact pad, and a second semiconductor package 102 mounted on circuit board 104 may include a respective solder ball 120 attached to the receiver contact pad. Accordingly, a transmitter die 106 of the first semiconductor package 102 may send an electrical signal to a receiver die 108 of the second semiconductor package 102 through impedance-boosting channel 112. Given that circuit board structures are typically layered similar to package substrate structures, one skilled in the art will understand how to adapt the channel geometries described above to circuit board 104. For example, the transmitter contact pad and the receiver contact pad may be within a respective top plane of circuit board 104, and impedance-boosting segments having arc segments may be included within another plane, e.g., a respective reference plane, of circuit board 104 below the respective top plane. Accordingly, the geometric structures of impedance-boosting channel 112, which are equally applicable to a circuit board channel, are not described further in the interest of brevity.

Regardless of whether impedance-boosting channel 112 is integrated within package substrate 110 or circuit board 104, the arc segment structures of impedance-boosting channel 112 may provide a similar improvement in electrical performance. Electrically, arc segments of impedance-boosting channel 112 generate additional self-inductance in the signal line between transmitter die 106 and receiver die 108. More particularly, when an electrical signal travels through impedance-boosting channel 112, the signal line itself may have an inductance. In an embodiment, a self-inductance of impedance-boosting segments having curved traces may be at least twice a self-inductance of top plane microvias or bottom plane microvias of the channel structure. Accordingly, an overall self-inductance of impedance-boosting channel 112 may increase by a margin proportional to the self-inductance of impedance-boosting segments as compared to convention non-curved on-package interconnects used to carry electrical signals between integrated dies of conventional multi-chip packages.

Figure 8:
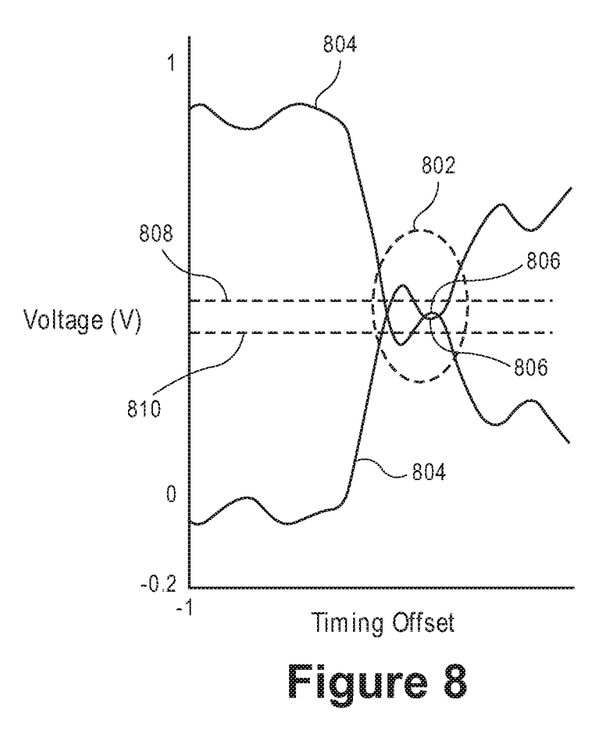
FIG. 8 illustrates an eye diagram representing an electrical performance of a conventional on-package interconnect extending between a transmitter die and a receiver die of a semiconductor package, in accordance with an embodiment.

Referring to FIG. 8, an eye diagram representing an electrical performance of a conventional on-package interconnect extending between a transmitter die and a receiver die of a semiconductor package is illustrated in accordance with an embodiment. The illustrated electrical performance is for a simulated conventional on-package interconnects having an effective impedance of 49 ohms. Such impedance is associated with interconnects having a manufacturing trace width limit of 9 microns, and a trace length less than 1 mm. More particularly, a die-to-die gap between a transmitter die and a receiver die placed in electrical communication by the simulated on-package interconnect is 0.5 mm, and a trace length of the simulated interconnect is 0.8 mm. Although such miniaturization of the package form factor reduces the overall package size, a return loss penalty occurs. More particularly, a signal integrity as viewed within an eye opening 802 of the waveform indicates that a critical electrical signal 804, e.g., a clock signal, transmitted from transmitter die 106 to receiver die 108 may include signal ledges 806 that overlap. Of course, voltage levels between voltage input high (VIH) and voltage input low (VIL) thresholds may result in an undefined logic state. Thus, the overlapping ledges 806 indicates that conventional on-package interconnects having trace lengths less than 1 mm provide unacceptable signal integrity characteristics.

Figure 9:
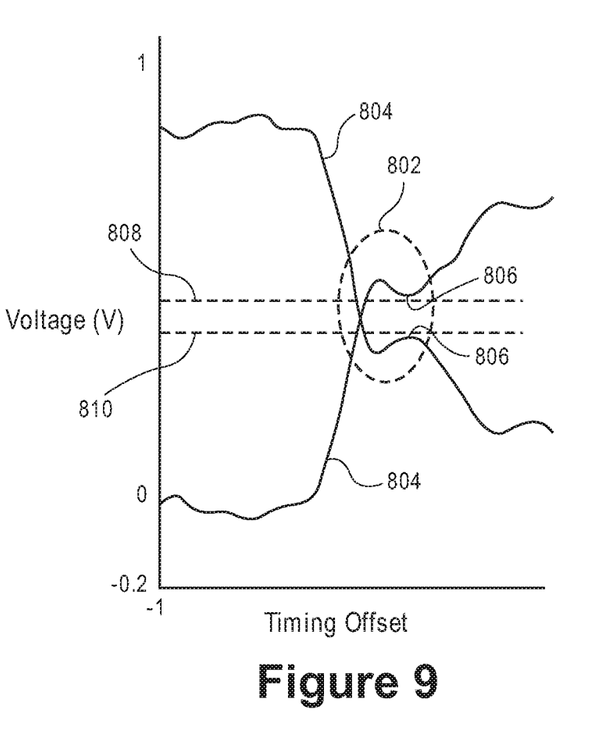
FIG. 9 illustrates an eye diagram representing an electrical performance of an impedance-boosting channel extending between a transmitter die and a receiver die of a semiconductor package, in accordance with an embodiment.

Referring to FIG. 9, an eye diagram representing an electrical performance of an impedance-boosting channel extending between a transmitter die and a receiver die of a semiconductor package is illustrated in accordance with an embodiment. Impedance-boosting channel 112 may improve signal integrity to allow closely mounted dies to communicate high and low signals that are distinguishable from each other. Impedance-boosting segments as described above are shown to boost an effective impedance of impedance-boosting channel 112 by more than 3 ohms, as compared to conventional on-package interconnects having similar trace lengths. Such an increase occurs in impedance-boosting channels 112 having transmitter electrical bump 202 and receiver electrical bump 204 separated by a lateral distance of less than 1 mm. More particularly, semiconductor package 102 incorporating impedance-boosting channel 112 may have a miniaturized form factor. A signal return loss of the miniaturized form factor inversely corresponds to effective impedance. For example, the increased impedance of impedance-boosting channel 112 shown in FIG. 2 may result in a signal return loss enhancement of 8 dB. As such, critical electrical signals 804 transmitted between transmitter die 106 and receiver die 108 through impedance-boosting channel 112 may have respective ledges 806 that are pushed apart from each other beyond the required minimum separation between VIH and VIL thresholds 808, 810. The separation between ledges 806 is seen within eye opening 802, which indicates that an electrical signal transmitted through impedance-boosting channel 112 can be recognized as a high or low bit of a clock signal. Stated differently, a reduced signal reflection in impedance-boosting channel 112 may result in improved signal integrity. Accordingly, semiconductor package 102 having impedance-boosting channel 112 may enable high-bandwidth communication between densely mounted dies, and semiconductor package 102 may be a low-power device due to the elimination of resistive terminations in the receiver circuitry design.

Figure 10:
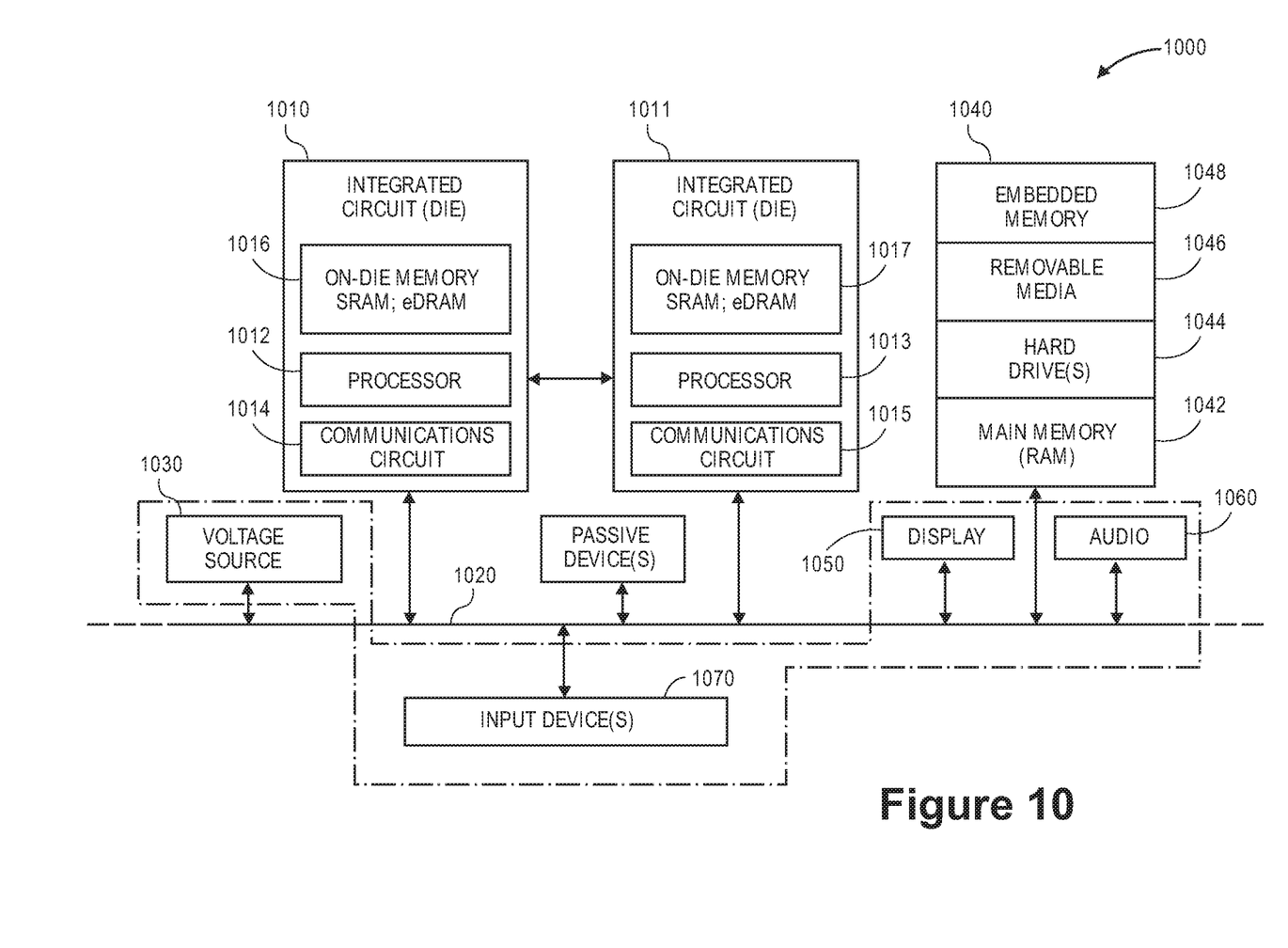
FIG. 10 is a schematic of a computer system, in accordance with an embodiment.

FIG. 10 is a schematic of a computer system, in accordance with an embodiment. The computer system 1000 (also referred to as the electronic system 1000) as depicted can embody a package substrate including an impedance-boosting channel 112 having several interconnected and laterally separated arc segments, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a package substrate including an impedance-boosting channel 112 having several interconnected and laterally separated arc segments, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1011 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, and an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate including an impedance-boosting channel 112 having several interconnected and laterally separated arc segments, according to any of the several disclosed embodiments and their equivalents, an electronic system, a computer system, one or more methods of fabricating an integrated circuit, and one or more methods of fabricating an electronic assembly that includes a package substrate including an impedance-boosting channel 112 having several interconnected and laterally separated arc segments, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a package substrate including an impedance-boosting channel 112 having several interconnected and laterally separated arc segments embodiments and their equivalents. A foundation substrate may be included, as represented by the dashed line of FIG. 10. Passive devices may also be included, as is also depicted in FIG. 10.

Embodiments including an impedance-boosting channel between a transmitter die and a receiver die are described above. In an embodiment, a semiconductor package substrate includes a transmitter bump pad disposed along a first vertical axis, a receiver bump pad disposed along a second vertical axis laterally offset from the first vertical axis, and an impedance-boosting channel extending between the transmitter bump pad and the receiver bump pad. The impedance-boosting channel includes a first impedance-boosting segment having a first arc segment extending around the first vertical axis, and a second impedance-boosting segment having a second arc segment extending around the second vertical axis.

In one embodiment, the first impedance-boosting segment includes a first end and a second end. The second impedance-boosting segment includes a third end and a fourth end. The first end is coupled to the transmitter bump pad by a first top plane microvia. The third end is coupled to the receiver bump pad by a second top plane microvia.

In one embodiment, the impedance-boosting channel further includes a lateral interconnect having a first terminal coupled to the second end by a first bottom plane microvia, and a second terminal coupled to the fourth end by a second bottom plane microvia.

In one embodiment, the impedance-boosting segments carry an electrical signal through a reference plane. The lateral interconnect carries the electrical signal through a bottom plane below the reference plane.

In one embodiment, the first impedance-boosting segment includes a third arc segment extending around a third vertical axis laterally offset from the first vertical axis.

In one embodiment, the first impedance-boosting segment includes a linear segment extending from the first arc segment to the third arc segment.

In one embodiment, the semiconductor package substrate includes a first interconnect pad disposed along the first vertical axis below the transmitter bump pad and having a first pad perimeter around the first vertical axis. The first arc segment extends around the first pad perimeter. The semiconductor package substrate includes a second interconnect pad disposed along the third vertical axis and having a second pad perimeter around the third vertical axis. The third arc segment extends around the second pad perimeter.

In one embodiment, the first arc segment includes a spiral segment between the first pad perimeter and the linear segment.

In one embodiment, the semiconductor package substrate includes a reference plane around the first impedance-boosting segment and the second impedance-boosting segment. The semiconductor package includes a dielectric spacer between the reference plane and the impedance-boosting segments. The arc segments extend through the dielectric spacer.

In an embodiment, a semiconductor package includes a package substrate including a transmitter bump pad disposed along a first vertical axis, a receiver bump pad disposed along a second vertical axis laterally offset from the first vertical axis, and an impedance-boosting channel extending between the transmitter bump pad and the receiver bump pad. The impedance-boosting channel includes a first impedance-boosting segment having a first arc segment extending around the first vertical axis, and a second impedance-boosting segment having a second arc segment extending around the second vertical axis. The semiconductor package includes a transmitter die mounted on the package substrate. The transmitter die includes a transmitter electrical bump mounted on the transmitter bump pad. The semiconductor package includes a receiver die mounted on the package substrate. The receiver die includes a receiver electrical bump mounted on the receiver bump pad. The transmitter die sends an electrical signal to the receiver die through the impedance-boosting channel.

In one embodiment, the first impedance-boosting segment includes a first end and a second end. The second impedance-boosting segment includes a third end and a fourth end. The first end is coupled to the transmitter bump pad by a first top plane microvia, and the third end is coupled to the receiver bump pad by a second top plane microvia.

In one embodiment, the impedance-boosting channel further includes a lateral interconnect having a first terminal coupled to the second end by a first bottom plane microvia, and a second terminal coupled to the fourth end by a second bottom plane microvia.

In one embodiment, the impedance-boosting segments carry the electrical signal through a reference plane. The lateral interconnect carries the electrical signal through a bottom plane below the reference plane.

In one embodiment, the first impedance-boosting segment includes a third arc segment extending around a third vertical axis laterally offset from the first vertical axis.

In one embodiment, the first impedance-boosting segment includes a linear segment extending from the first arc segment to the third arc segment.

In an embodiment, a semiconductor package assembly includes a circuit board having a transmitter contact pad disposed along a first vertical axis, a receiver contact pad disposed along a second vertical axis laterally offset from the first vertical axis, and an impedance-boosting channel extending between the transmitter contact pad and the receiver contact pad. The impedance-boosting channel includes a first impedance-boosting segment having a first arc segment extending around the first vertical axis, and a second impedance-boosting segment having a second arc segment extending around the second vertical axis. The semiconductor package assembly includes a first semiconductor package mounted on the circuit board. The first semiconductor package includes a transmitter die. The semiconductor package assembly includes a second semiconductor package mounted on the circuit board. The second semiconductor package includes a receiver die. The transmitter die sends an electrical signal to the receiver die through the impedance-boosting channel.

In one embodiment, the first impedance-boosting segment includes a first end and a second end. The second impedance-boosting segment includes a third end and a fourth end. The first end is coupled to the transmitter contact pad by a first top plane microvia. The third end is coupled to the receiver contact pad by a second top plane microvia.

In one embodiment, the impedance-boosting channel further includes a lateral interconnect having a first terminal coupled to the second end by a first bottom plane microvia, and a second terminal coupled to the fourth end by a second bottom plane microvia.

In one embodiment, the impedance-boosting segments carry the electrical signal through a reference plane. The lateral interconnect carries the electrical signal through a bottom plane below the reference plane.

In one embodiment, the first impedance-boosting segment includes a third arc segment extending around a third vertical axis laterally offset from the first vertical axis. The first impedance-boosting segment includes a linear segment extending from the first arc segment to the third arc segment.

What is claimed is:

1. A semiconductor package substrate, comprising:
   a transmitter bump pad disposed along a first vertical axis;
   a receiver bump pad disposed along a second vertical axis laterally offset from the first vertical axis; and
   an impedance-boosting channel extending between the transmitter bump pad and the receiver bump pad, wherein the impedance-boosting channel includes a first impedance-boosting segment having a first arc segment extending around the first vertical axis, and a second impedance-boosting segment having a second arc segment extending around the second vertical axis, wherein the first impedance-boosting segment and the second impedance-boosting segment are in the semiconductor package substrate, wherein the semiconductor package substrate is a single continuous semiconductor package substrate.

2. The semiconductor package substrate of claim 1, wherein the first impedance-boosting segment includes a first end and a second end, wherein the second impedance-boosting segment includes a third end and a fourth end, wherein the first end is coupled to the transmitter bump pad by a first top plane microvia, and wherein the third end is coupled to the receiver bump pad by a second top plane microvia.

3. The semiconductor package substrate of claim 2, wherein the impedance-boosting channel further includes: a lateral interconnect having a first terminal coupled to the second end by a first bottom plane microvia, and a second terminal coupled to the fourth end by a second bottom plane microvia.

4. The semiconductor package substrate of claim 3, wherein the impedance-boosting segments carry an electrical signal through a reference plane, and wherein the lateral interconnect carries the electrical signal through a bottom plane below the reference plane.

5. The semiconductor package substrate of claim 1, wherein the first impedance-boosting segment includes a third arc segment extending around a third vertical axis laterally offset from the first vertical axis.

6. The semiconductor package substrate of claim 5, wherein the first impedance-boosting segment includes a linear segment extending from the first arc segment to the third arc segment.

7. The semiconductor package substrate of claim 6 further comprising:
a first interconnect pad disposed along the first vertical axis below the transmitter bump pad and having a first pad perimeter around the first vertical axis, wherein the first arc segment extends around the first pad perimeter; and a second interconnect pad disposed along the third vertical axis and having a second pad perimeter around the third vertical axis, wherein the third arc segment extends around the second pad perimeter.

8. The semiconductor package substrate of claim 7, wherein the first arc segment includes a spiral segment between the first pad perimeter and the linear segment.

9. The semiconductor package substrate of claim 1 further comprising:
a reference plane around the first impedance-boosting segment and the second impedance-boosting segment, and a dielectric spacer between the reference plane and the impedance-boosting segments, wherein the arc segments extend through the dielectric spacer.

10. A semiconductor package, comprising:
a package substrate including a transmitter bump pad disposed along a first vertical axis, a receiver bump pad disposed along a second vertical axis laterally offset from the first vertical axis, and
an impedance-boosting channel extending between the transmitter bump pad and the receiver bump pad, wherein the impedance-boosting channel includes a first impedance-boosting segment having a first arc segment extending around the first vertical axis, and a second impedance-boosting segment having a second arc segment extending around the second vertical axis, wherein the first impedance-boosting segment and the second impedance-boosting segment are in the package substrate, wherein the package substrate is a single continuous package substrate;
a transmitter die mounted on the package substrate, wherein the transmitter die includes a transmitter electrical bump mounted on the transmitter bump pad; and
a receiver die mounted on the package substrate, wherein the receiver die includes a receiver electrical bump mounted on the receiver bump pad, and wherein the transmitter die sends an electrical signal to the receiver die through the impedance-boosting channel.

11. The semiconductor package of claim 10, wherein the first impedance-boosting segment includes a first end and a second end, wherein the second impedance-boosting segment includes a third end and a fourth end, wherein the first end is coupled to the transmitter bump pad by a first top plane microvia, and wherein the third end is coupled to the receiver bump pad by a second top plane microvia.

12. The semiconductor package of claim 11, wherein the impedance-boosting channel further includes: a lateral interconnect having a first terminal coupled to the second end by a first bottom plane microvia, and a second terminal coupled to the fourth end by a second bottom plane microvia.

13. The semiconductor package of claim 12, wherein the impedance-boosting segments carry the electrical signal through a reference plane, and wherein the lateral interconnect carries the electrical signal through a bottom plane below the reference plane.

14. The semiconductor package of claim 10, wherein the first impedance-boosting segment includes a third arc segment extending around a third vertical axis laterally offset from the first vertical axis.

15. The semiconductor package of claim 14, wherein the first impedance-boosting segment includes a linear segment extending from the first arc segment to the third arc segment.

16. A semiconductor package assembly, comprising:
a circuit board having a transmitter contact pad disposed along a first vertical axis, a receiver contact pad disposed along a second vertical axis laterally offset from the first vertical axis, and an impedance-boosting channel extending between the transmitter contact pad and the receiver contact pad, wherein the impedance-boosting channel includes a first impedance-boosting segment having a first arc segment extending around the first vertical axis, and a second impedance-boosting segment having a second arc segment extending around the second vertical axis, wherein the first impedance-boosting segment and the second impedance-boosting segment are in the circuit board;
a first semiconductor package mounted on the circuit board, wherein the first semiconductor package includes a transmitter die; and
a second semiconductor package mounted on the circuit board, wherein the second semiconductor package includes a receiver die, and wherein the transmitter die sends an electrical signal to the receiver die through the impedance-boosting channel.

17. The semiconductor package assembly of claim 16, wherein the first impedance-boosting segment includes a first end and a second end, wherein the second impedance-boosting segment includes a third end and a fourth end, wherein the first end is coupled to the transmitter contact pad by a first top plane microvia, and wherein the third end is coupled to the receiver contact pad by a second top plane microvia.

18. The semiconductor package assembly of claim 17, wherein the impedance-boosting channel further includes: a lateral interconnect having a first terminal coupled to the second end by a first bottom plane microvia, and a second terminal coupled to the fourth end by a second bottom plane microvia.

19. The semiconductor package assembly of claim 18, wherein the impedance-boosting segments carry the electrical signal through a reference plane, and wherein the lateral interconnect carries the electrical signal through a bottom plane below the reference plane.

20. The semiconductor package assembly of claim 16, wherein the first impedance-boosting segment includes a third arc segment extending around a third vertical axis laterally offset from the first vertical axis, and wherein the first impedance-boosting segment includes a linear segment extending from the first arc segment to the third arc segment.

21. A semiconductor package substrate, comprising:
a transmitter bump pad disposed along a first vertical axis;
a receiver bump pad disposed along a second vertical axis laterally offset from the first vertical axis;
an impedance-boosting channel extending between the transmitter bump pad and the receiver bump pad, wherein the impedance-boosting channel includes a first impedance-boosting segment having a first arc segment extending around the first vertical axis, and a second impedance-boosting segment having a second arc segment extending around the second vertical axis, wherein the first impedance-boosting segment includes a third arc segment extending around a third vertical axis laterally offset from the first vertical axis, wherein the first impedance-boosting segment includes a linear segment extending from the first arc segment to the third arc segment; and
a first interconnect pad disposed along the first vertical axis below the transmitter bump pad and having a first pad perimeter around the first vertical axis, wherein the first arc segment extends around the first pad perimeter; and a second interconnect pad disposed along the third vertical axis and having a second pad perimeter around the third vertical axis, wherein the third arc segment extends around the second pad perimeter.

22. The semiconductor package substrate of claim 21, wherein the first arc segment includes a spiral segment between the first pad perimeter and the linear segment.

* * * * *